Dec. 12, 1967 J. R. DALE 3,357,870

SEMI-CONDUCTOR DEVICE

Filed Dec. 22, 1964

INVENTOR.
JOHN R. DALE

BY
Frank R. Trifari
AGENT

United States Patent Office 3,357,870

Patented Dec. 12, 1967

3,357,870
SEMICONDUCTOR DEVICE

John Robert Dale, Westdene, Brighton, England, assignor to North American Philips Company, Inc., New York, N.Y., a corporation of Delaware Filed Dec. 22, 1964, Ser. No. 420,287
Claims priority, application Great Britain, Dec. 23, 1963, 50,672/63
20 Claims. (Cl. 148—175)

Figure 1:
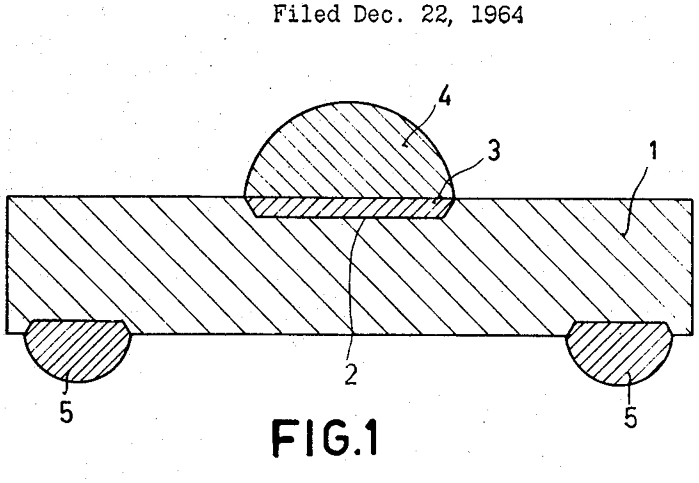

This invention relates to semiconductor devices comprising a junction between dissimilar materials at least one of which is a semiconductor material. The invention also relates to methods of manufacturing such semiconductor devices.

In co-pending application, Ser. No. 479,546, filed Aug. 31, 1965, there is described and claimed an opto-electronic semiconductor device comprising a semiconductor body having a first, photon-emissive p-n junction capable of emitting photons with a quantum efficiency greater than 0.1 when suitably biased in the forward direction and a photo-sensitive part comprising a second photo-sensitive p-n junction for transforming the energy of photons emanating from the first p-n junction to that of charge carriers when the second p-n junction is suitably biased in the reverse direction, the distance between the first p-n junction and the second p-n junction being at least one diffusion length from the first p-n junction of the charge carriers injected by that junction into the adjacent region of the body intermediate the first and second junctions. Such a device may be considered to correspond to a known p-n-p or n-p-n transistor in a sense that in both cases use is made of a p-n junction forming the electric input, which is biased in the forward direction, and of a p-n junction forming the electric output, biased in the reverse direction and the device may conveniently be referred to as an opto-electronic transistor.

The said co-pending application also described a device in which the photo-sensitive part consists of a semiconductor material having a smaller energy gap than the semiconductor material adjacent the first p-n junction, so that specifically in the photo-sensitive part an enhanced absorption and transformation is obtained. The specification further describes such a device in which the photo-sensitive part is provided by epitaxial growth on the semiconductor material adjacent the first p-n junction and also in which the second p-n junction substantially coincides with the boundary of the epitaxial layer.

Thus the second p-n junction may consist of a heterojunction with the semiconductor material on that side of the second p-n junction from the first p-n junction of lower energy gap than the semiconductor material on the side of the second p-n junction adjacent the first p-n junction. Using the conventional terms in the transistor art the first p-n junction is the emitter-base junction and the second p-n junction is the collector-base junction. Thus, in the above described device comprising a heterojunction at the second p-n junction the collector region is of a lower energy gap material than that of the base region.

In a letter from R. H. Rediker, T. M. Quist and B. Lax in Proc. I.E.E.E. January 1963, pages 218 and 219, a photo-diode structure is proposed in which the p-n junction is a heterojunction and in which the frequency response does not depend critically on the distance of the junction from the surface but rather depends on the relative absorption of the incident radiation in the two materials forming the heterojunction. A high speed response photo-diode containing a p-Ge, n-GaAs heterojunction is proposed as a detector for the 8450 A. radiation emitted from a GaAs diode. If the junction is 10 microns from the surface, the absorption coefficient of Ge at the wavelength of the emitted radiation being about $2.4\times10^4$ cm.$^{-1}$ and of GaAs about 10 cm.$^{-1}$, most of the radiation is absorbed in the Ge within 1 micron of the junction. It is thus possible with suitable impurity concentrations and crystal orientations of the heterojunction interface, to have the space-charge region of Ge several times the absorption length. The absorption length is defined as the reciprocal of the absorption coefficient. The letter further proposes an opto-electronic transistor mentioned as a "beam of light" transistor with an infrared emitting GaAs p-n homojunction as emitter and an n-GaAs, p-Ge heterojunction as collector.

The present invention relates particularly to photodiodes comprising a junction between dissimilar materials having p-n junction characteristics and opto-electronic transistors comprising a collector-base junction between dissimilar materials, but is not exclusively limited to such semiconductor devices, as the invention also relates to other semiconductor devices for example tunnel diodes comprising a junction between dissimilar materials having p-n tunneling junction characteristics, and high speed of response switching diodes comprising a junction between dissimilar materials having characteristics similar to the characteristics of those high speed of response switching diodes having an n-n or p-p junction, the operation of which depends only on the passage of majority carriers.

According to a first aspect of the invention, a semiconductor device comprises a junction between a first region consisting of manganese arsenide ($Mn_2As$) and a second region consisting of a III–V semiconductor compound or a substituted III–V semiconductor compound.

Reference herein to $Mn_2As$ is to be understood to mean that the crystal structure of the materials is that of the compound $Mn_2As$, but compositions in which the manganese content differs from the exact stoichiometric proportions of $Mn_2As$ are also included, for example, compositions in the range $Mn_{1.9}As$ to $Mn_{2.3}As$.

Reference to a III–V semiconductor compound is to be understood to mean a compound between substantially equally atomic amounts of an element of the class consisting of boron, aluminum, gallium and indium of the III–A group of the Periodic System of the elements and an element of the class consisting of nitrogen, phosphorus, arsenic and antimony of the V–A group of the Periodic System of the elements. Reference to a substituted III–V semiconductor compound is to be understood to mean a III–V semiconductor compound in which part of the atoms of the element of the above class of the III–A group is replaced by atoms of another element or other elements of the same class and/or part of the atoms of the element of the above class of the V–A group is replaced by atoms of another element or other elements of the same class.

When speaking of a junction between a first region consisting of manganese arsenide ($Mn_2As$) and a second region consisting of a III–V semiconductor compound or a substituted III–V semiconductor compound it should be understood that such a junction might include one or more very thin intermediate zones either consisting of another compound than those of the said regions and having a different crystal structure or consisting of manganese arsenide ($Mn_2As$) or a III–V compound, having a different composition and/or differently doped in comparison with the first region or the second region respectively. Said intermediate zone or zones may be present without being readily detectable. However, in some cases the existence of such a thin zone was found. It should further be understood that relative thick intermediate zones are not intended to be included in the term "junction," but should only include one or more thin intermediate zones the thickness or the sum of the thicknesses respectively of which is at most in the order of magnitude of 1 micron.

Semiconductor devices comprising such a junction may have improved electrical and/or optical characteristics, for example, it is possible to construct high speed of response switching diodes having a switching speed of 3 to 6 nanoseconds, and photo-diodes having a quantum collection efficiency of light at 9,000 A. of at least 70%. Thus it appears that, from calculations based on the quantum collection efficiency obtainable in photo-diodes, opto-electronic transistors in which the junction forms the collector-base-junction having a quantum collection efficiency of light at 9,000 A. of up to or even greater than 95% may be constructed, Arsenic may be the element or at least one element of the fifth group of the periodic table in the III–V semiconductor compound or in the substituted III–V semiconductor compound respectively.

The junction may in certain instances be capable of being manufactured in a particularly simple manner. Thus a preferred form of the device comprises a junction between a region of manganese arsenide ($Mn_2As$) crystallised from a melt on a substrate of the III–V semiconductor compound or the substituted III–V semiconductor compound.

The region of manganese arsenide ($Mn_2As$) may be epitaxially crystallised from the melt on the substrate. An epitaxial growth, in the particular case under consideration being from the liquid phase, is that which exhibits a crystal orientation related to that of the substrate on which the growth occurs.

The region of manganese arsenide ($Mn_2As$) may be associated with a resolidified region consisting predominantly of a carrier material for manganese and arsenic in the formation of a melt on the substrate from which the region of manganese arsenide is crystallised.

The III–V semiconductor compound may be, for example, gallium arsenide.

The substituted III–V semiconductor compound may be, for example, gallium arseno-phosphide ($GaAs_{1-x}P_x$).

When the III–V semiconductor compound is gallium arsenide and the device comprises a region of manganese arsenide ($Mn_2As$) associated with a resolidified region consisting mainly of a carrier material, this carrier material may be, for example, bismuth. In this case the resolidified region may additionally contain another element of the abovementioned class of the III–A group than gallium, preferably indium. It may further comprise arsenic.

The region of manganese arsenide ($Mn_2As$) may contain a significant impurity material or materials affecting its electrical properties such as its conductivity and/or affecting the electrical properties of the junction with the III–V compound or substituted III–V compound.

The region of manganese arsenide ($Mn_2As$) may be associated with a thin intermediate zone of manganese arsenide having a different crystal structure, such as the structure of $Mn_3As_2$, between this region and the region of the III–V semiconductor compound or the substituted III–V semiconductor compound. The junction between the region of manganese arsenide ($Mn_2As$) and the region of the III–V or substituted III–V semiconductor compound may comprise a thin intermediate zone of a solid solution of the III–V or substituted III–V semiconductor compound of the substrate and a III–V semiconductor compound of other composition.

When such intermediate zones are present their thickness may be of the order of one micron or less.

A further form of the semiconductor device according to the invention comprises a junction between a region of manganese arsenide ($M_2As$) epitaxially grown from the vapour phase on a substrate of the III–V semiconductor compound or the substituted III–V semiconductor compound, and the substrate.

Another form of the semiconductor device according to the invention comprises a junction between a region of the III–V semiconductor compound or the substituted III–V semiconductor compound epitaxially grown from the vapour phase on a substrate of manganese arsenide ($Mn_2As$), and the substrate.

When the III–V semiconductor compound is gallium arsenide and when the junction is formed by epitaxial growth, either from the liquid or vapour phase it is found that the lattice mismatch between the 100 plane of gallium arsenide and the 001 plane of manganese arsenide ($Mn_2As$) is less than 5%.

The junction may be rectifying or ohmic. The rectifying junction may be between regions of the same or different conductivity types.

The junction may form the collector-base junction of an opto-electronic transistor. Thus in a preferred embodiment the opto-electronic transistor comprises a base region of gallium arsenide and a collector region of manganese arsenide ($Mn_2As$) crystallised from a melt on the gallium arsenide region. The properties of the compound manganese arsenide ($Mn_2As$) are not fully determined but it is found that at or near the junction of the crystallised region of manganese arsenide ($Mn_2As$) with the substrate of the III–V semiconductor substrate region efficient absorption of photons within the depletion region of the collector-base junction may be obtained, especially photons of such wavelength which are not substantially absorbed by the substrate region. Hence the advantage arises that it is possible to fabricate the collector-base junction in an opto-electronic transistor by an alloying process at a temperature significantly lower than that required to form the junction by diffusion techniques or by epitaxial growth from the vapour phase. This results in that at the comparatively low temperature required for the alloying process, for example, 550° C., the diffusion of any of the elements of the III–V compound or any additional significant impurity element contained thereon does not occur to an appreciable extent or at least such a diffusion may only take place in a very thin zone. Further advantages of the junction formed by an alloying process are that the junction may be confined to a limited area of the body, the junction may have a lower capacitance than occurs in a simlar junction formed by epitaxial growth from the vapour phase or diffusion techniques, the ohmic contact to the region of manganese arsenide ($Mn_2As$) may be formed simultaneously and due to the said absence of any substantial or substantially deep diffusion, the interface between the manganese arsenide crystal lattice and the III–V compound crystal lattice may be conveniently arranged to be situated at or in the immediate vicinity of the location of an eventually formed p-n junction or a junction having similar properties. Such advantages also occur in a further preferred embodiment in which the junction has the characteristics of a p-n junction and is used in a photo-diode which may be thus fabricated by a relatively simple alloying process.

According to a second aspect of the invention, in a method of manufacturing a semiconductor device comprising a junction between manganese arsenide ($Mn_2As$) and a III–V semiconductor compound or a substituted III–V semiconductor compound, a region of the III–V semiconductor compound or the substituted III–V semiconductor compound is grown, for example, epitaxially grown, on a substrate of manganese arsenide ($Mn_2As$).

According to a third aspect of the invention, in a method of manufacturing a semiconductor device comprising a junction between manganese arsenide ($Mn_2As$) and a III–V semiconductor compound or a substituted III–V semiconductor compound, a region of manganese arsenide ($Mn_2As$) is grown on a substrate of the III–V semiconductor compound or the substituted III–V semiconductor compound respectively.

In a preferred form of this method the region of manganese arsenide ($Mn_2As$) is crystallised from a melt on the substrate. The region of manganese arsenide ($Mn_2As$) may be epitaxially crystallised from the melt on the substrate. Arsenic may be the element of the fifth group of the periodic table in the III–V semiconductor compound or the substituted III–V semiconductor compound of the substrate.

When alloying material to a semiconductor body a molten pool consisting of the material to be alloyed and an adjacent volume of the semiconductor body is produced and cooled. On cooling, under suitable conditions normally first a crystallised part which forms an extension of the crystal lattice of the body and containing mainly the material of the body together with a small amount of the material to be alloyed solidifies and this material which is rejected from solution in its original crystalline form is generally referred to as the recrystallised material. Thereinafter the remainder of the molten material consisting mainly of the material to be alloyed together with a small amount of the material of the semiconductor body solidifies and is generally referred to as the resolidified material. In the said preferred form of the method in which the region of manganese arsenide ($Mn_2As$) is crystallised from a melt on the substrate the region may be formed by an alloying process but the material, that is manganese arsenide, is rejected from solution in a crystalline form which is not that of the original material of the substrate. However, the term "epitaxially crystallised" or "epitaxially grown," when used in this specification in relation to a junction between a region having $Mn_2As$ crystal structure and a region having the crystal structure of a III–V compound, signifies that one region has a preferred crystal orientation with respect to the orientation of the crystal lattice of the other region.

The region of manganese arsenide ($Mn_2As$) may be crystallised or epitaxially crystallised, according, inter alia, to the conditions of cooling and substrate orientation, from a melt on the substrate formed on alloying manganese in a carrier material to the substrate in which arsenic is the element or at least one element of the fifth group of the periodic table in the substrate. Alternatively, the melt on the substrate may be formed on alloying a material comprising manganese and arsenic, f.i. comprising manganese arsenide, in a carrier material to the substrate, arsenic being the element or at least one element of the fifth group of the periodic table in the substrate.

In the said method in which the region of manganese arsenide ($Mn_2As$) is crystallised or epitaxially crystallised from a melt on a substrate in which arsenic is the element or at least one element of the fifth group of the periodic table in the substrate, the III–V semiconductor compound substrate may consist, for example of gallium arsenide and the substituted III–V semiconductor compound substrate may consist, for example, of gallium arseno-phosphide.

When the substrate is of gallium arsenide and the melt is formed on alloying manganese in a carrier material to the substrate or on alloying manganese arsenide in a carrier material to the substrate, the carrier material may be, for example, bismuth. When alloying bismuth and manganese to a gallium arsenide substrate, under certain conditions a thin intermediate layer of ($Mn_3As_2$) may be formed between the substrate and the region of manganese arsenide ($Mn_2As$). The material alloyed may consist of bismuth, manganese and a III–A group element and arsenic, f.i., added in the form of a quantity of a III–V semiconductor compound in which arsenic is the element of the fifth group of the periodic table to a bismuth manganese alloy, for example, indium arsenide, but the material alloyed may, however, also comprise indium in another form.

Thus in a preferred embodiment bismuth, manganese and indium arsenide are alloyed on a substrate of gallium arsenide and, according to conditions of cooling and substrate orientation, a region of manganese arsenide ($Mn_2As$) is crystallised or epitaxially crystallised. Under some conditions a thin intermediate zone of a solid solution of gallium indium arsenide or under other conditions a thin zone of ($Mn_3As_2$) may be formed between the substrate and the region of manganese arsenide. Gallium indium arsenide has a lower band gap than gallium arsenide and thus might absorb radiation having a wavelength for which gallium arsenide is substantially transparent.

Significant impurity material or materials may be incorporated in the material alloyed to affect the conductivity without affecting the conductivity type or affecting both the conductivity and the conductivity type of the crystallised or epitaxially crystallised region of manganese arsenide or, anyhow, to affect the properties of the junction between the region of manganese arsenide and the substrate region. When such material is alloyed the concentration in the crystallised or epitaxially crystallised region of manganese arsenide may be appreciably less than its initial concentration in the material alloyed. It is found that the addition of material such as indium may serve to influence the properties of the above junction to a considerable extent.

The various materials alloyed to the substrate may all be alloyed together by placing a pellet consisting of an alloy or an intimate mixture of the materials on the substrate and heating. As an alternative the materials may first be melted together and brought into contact in a molten state on the substrate. As a further alternative, in certain instances, the materials may not be alloyed to the substrate in a single operation, one or more of a plurality of materials being either alloyed separately to an existing alloy region on the substrate or added to a molten part already present on the substrate.

When bismuth and manganese are alloyed to a substrate of gallium arsenide the proportions of the components alloyed may vary from 1% to 30% of manganese.

In the said preferred embodiment of the method in which bismuth, manganese, indium and arsenic are alloyed to a substrate of gallium arsenide similar proportions and ranges of manganese in the bismuth-manganese-indium-arsenic alloy and in the total material alloyed may be used and when the indium and arsenic are added to the bismuth and manganese in the form of indium arsenide, the amount of indium arsenide in this alloy may vary from 5% to 20% and may preferably be substantially 15%.

The proportions given above, when alloying to an n-type substrate of gallium arsenide being uniformly doped with tellurium in a concentration of $3 \times 10^{16}$ atoms/cc. will result in crystallised or epitaxially crystallised regions of manganese arsenide ($Mn_2As$) forming a junction with the substrate material having properties similar to those of a p-n junction.

It is, however, pointed out that for a heavily doped body the properties of the crystallised or epitaxially crystallised region and/or its junction with the substrate may be determined by a significant impurity with which the substrate is initially heavily doped.

When alloying bismuth and manganese or bismuth, manganese and indium arsenide to a substrate of gallium arsenide the alloying temperature may be between 500° C. and 600° C., f.i., 550° C., at which temperatures the materials substantially do not appear to be unstable. The use of higher temperatures may result in a loss of arsenic from the substrate. Alloying may be effected in an inert gaseous atmosphere, for example in argon, or alternatively alloying may be effected in vacuo or a reducing atmosphere. The duration of heating necessary for alloying is not very critical, it may be one hour, longer or shorter according to the materials concerned and the object in view. Cooling from the alloying temperature preferably is not chosen very short, it may be during a period of four hours, longer or shorter, and the rate of cooling adjusted as is necessary for the materials concerned in order to obtain a satisfactory epitaxially crystallised region of manganese arsenide ($Mn_2As$).

Figure 2:
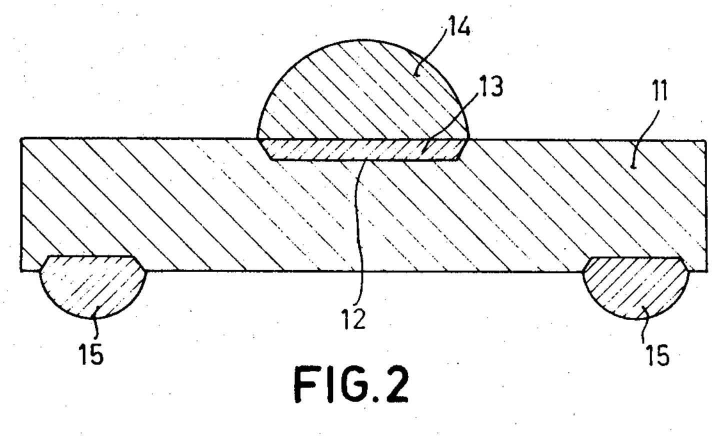
Figure 3:
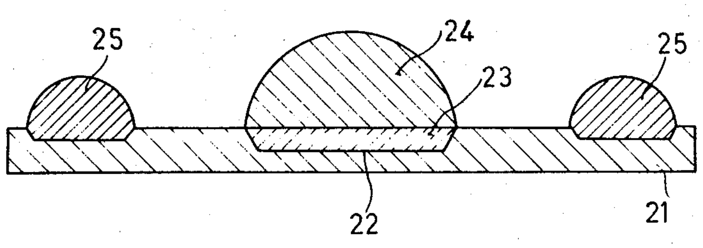

Three embodiments of a semiconductor device according to the first aspect of the invention will now be described, by way of example, together with details of the method of manufacture according to the third aspect of the invention, with reference to the accompanying diagrammatic drawings in which, FIGURES 1, 2 and 3 show sections of three different photo-diodes during a stage of manufacture prior to connection of leads to the various regions and subsequent encapsulation.

In a first embodiment shown in FIGURE 1 a photodiode comprises a wafer shaped body 1 of n-type gallium arsenide doped with tellurium in a concentration of $3\times10^{16}$ atoms/cc. in which a junction 2 having properties similar to a p-n junction is present on one side of the body between the body and an epitaxially crystallised region 3 of manganese arsenide ($Mn_2As$). Situated above the crystallised region is a resolidified region 4 which projects above the surface of the wafer and forms an ohmic contact to the epitaxially crystallised region and consists mainly of bismuth with a little manganese and gallium. The junction interface is flat, is at a depth of about 50 microns from the surface and the thickness of the crystallised region is about 50 microns. On the opposite surface of the wafer alloyed ohmic contacts 5 to the n-type region are present which substantially consist of bismuth, tin, platinum, gallium and arsenic. The diode has a rectification ratio of $10^4$, a series resistance of 25 ohms and a breakdown voltage of 7 volts at room temperature.

The photo-diode is manufactured from single crystal n-type gallium arsenide uniformly doped with tellurium in a concentration of $3\times10^{16}$ atoms/cc. and a wafer shaped body is obtained, by the usual techniques of slicing along planes parallel to the 100 plane, dicing and etching, having dimensions of 3 mm. x 3 mm. x ½ mm. thickness. The body is placed in a carbon graphite jig and on the 100 face there is placed a 1 mm. diameter pellet of an alloy of 80% bismuth and 20% manganese.

This material to be alloyed is prewetted to the body at 450° C. Two ½-mm. diameter pellets of a bismuth-tin-platinum alloy, the relative parts by weight being 54, 44 and 2, respectively, are placed on and prewetted at 450° C. to the opposite surface of the body. The whole assembly is then sealed off in an evacuated silica tube and heated at 500° C. for one hour. After heating the assembly is slowly cooled, still in vacuo, for four hours to room temperature. The jig is then removed from the tube, the wafer shaped body removed from the jig and connecting wires of platinum are soldered to the resolidified part 4 and to the alloy contacts 5 subsequent to giving the body a light etch in a solution of bromine (30%) in methanol. The diode may then be encapsulated as is desired.

In a second embodiment shown in FIGURE 2 a further photo-diode comprises a wafer shaped body 11 of n-type gallium arsenide doped with tellurium in a concentration of $3\times10^{16}$ atoms/cc. in which a junction 12 having properties similar to a p-n junction, is present on one side of the body between the body and an epitaxially crystallised region 13 of manganese arsenide ($Mn_2As$). Situated above the crystallised region is a resolidified region 14 which projects above the surface of the wafer and forms an ohmic contact to the epitaxially crystallised region and comprises mainly bismuth, indium, arsenic and gallium. The junction interface is flat, is at a depth of about 50 microns from the surface and the thickness of the crystallised region of manganese arsenide ($Mn_2As$) is about 50 microns. On the opposite surface of the wafer ohmic alloying contacts 15 to the n-type region are present which substantially consist of bismuth, tin, platinum, gallium and arsenic. The diode has a rectification ratio of $10^5$, a series resistance of 30 ohms, breakdown voltages of 10 volts and 90 volts at room temperature and liquid nitrogen temperature respectively, a measured quantum efficiency of about 70% for light at about 9,000 A., and a response time of about 5 nanoseconds.

The photo diode shown in FIG. 2 is manufactured from single crystal n-type gallium arsenide uniformly doped with tellurium in a concentration of $3.0\times10^{16}$ atoms/cc. and a wafer shaped body is obtained by the usual techniques of slicing parallel to the 100 plane, dicing and etching, having dimensions of 3 mm. x 3 mm x ½ mm. thickness. The body is placed in a carbon graphite jig and on the 100 face there is placed a 1 mm. diameter pellet of an alloy of bismuth, manganese (10%) and indium arsenide (15%) together with a small chip of manganese sufficient to make the manganese content of the material alloyed up to 25%. This material to be alloyed is prewetted to the body at 450° C. Two ½-mm. diameter pellets of an alloy of bismuth, tin and platinum, the relative parts by weight being 54, 44 and 2, respectively, are placed on and prewetted at 450° C. to the opposite surface of the body. The whole assembly is then sealed off in an evacuated silica tube and heated at 500° C. for one hour. After heating the assembly is slowly cooled still in vacuo, for four hours, to room temperature. The jig is removed from the tube, the wafer shaped body removed from the jig and connecting wires of platinum are soldered to the resolidified part 14 and to the alloy contacts 15 subsequent to giving the body a light etch in a solution of bromine (30%) in methanol. The photo-diode may then be encapsulated as desired.

In a third embodiment shown in FIGURE 3 a further photo-diode comprises a wafer-shaped body 21 of n-type gallium arsenide doped with tellurium in a concentration of $1.0\times10^{16}$ atoms/cc. in which a junction 22 having properties similar to a p-n junction, is present on one side of the body between the body and an epitaxially crystallised region 23 of manganese arsenide ($Mn_2As$). Situated above the crystallised region is a resolidified region 24 which projects above the surface of the wafer and forms an ohmic contact to the epitaxially crystallised region and consists mainly of bismuth, indium, arsenic and gallium. The junction interface is flat, has a depth of about 50 microns from the surface and the thickness of the crystallised region of manganese arsenide ($Mn_2As$) is about 50 microns. On the same surface of the wafer ohmic alloy contacts 25 to the n-type region of the body are present which substantially consist of bismuth, tin, platinum, gallium and arsenic. The diode has a rectification ratio of $10^5$, a series resistance of 30 ohms, a breakdown voltage of 45 volts at room temperature, a measured quantum efficiency of about 70% for light at about 9,000 A., and a response time of 3 to 6 nanoseconds.

The photo-diode shown in FIG. 3 is manufactured from single crystal n-type gallium arsenide uniformly doped with tellurium in a concentration of $1.0\times10^{16}$ atoms/cc. and a wafer shaped body having dimensions 3 mm. x 2 mm. x 0.1 mm., is obtained by the usual techniques of slicing parallel to the 100 plane, dicing and etching. The body is placed in a carbon graphite jig and at the centre of the 100 face there is placed a 1 mm. diameter pellet of an alloy of manganese (10%), indium arsenide (15%) and bismuth (75%). Two ½-mm. diameter pellets of an alloy of bismuth, tin and platinum, the relative parts by weight being 54, 44 and 2, respectively, are placed on the same surface of the body at opposite extremities thereof. The pellets are now prewetted to the body at 450° C. The whole assembly is sealed off in an evacuated silica tube and heated at 560° C. for 30 mins. After heating the assembly is slowly cooled, still in vacuo, for six hours to room temperature. The jig is removed from the tube, the wafer shaped body removed from the jig and connecting wires of platinum are soldered to the resolidified part 24 and the alloy contacts 25 subsequent the invention described relative to photo-diodes, the man- (30%) in methanol. The diode is then encapsulated as is desired.

It will be appreciated that while the embodiments of the invention described relate to photo-diodes, the manufacturing techniques described may be readily adapted to form such a junction as is present in such a photodiode as a base-collector junction in an opto-electronic transistor. It is calculated that such junctions will have a quantum efficiency which may amount to about 95% for light at about 9,000 A., a wave-length for which gallium arsenide is substantially transparent and which may be produced by a photon-emmissive p-n junction in gallium arsenide.

What is claimed is:

1. A semiconductor device comprising at least first and second adjacent regions forming a junction, said first region consisting essentially of manganese arsenide isomorphous with the compound $Mn_2As$ and having approximately the same empirical formula, said secnd region being selected from the group consisting of a III–V compound and a substituted III–V compound, wherein the III element is at least one member selected from the group consisting of boron, aluminum, gallium and indium, and the V element is at least one member selected from the group consisting of nitrogen, phosphorus, arsenic and antimony.

2. A semiconductor device as set forth in claim 1 wherein arsenic is the said V element.

3. A semiconductor device as set forth in claim 1 wherein said first and second regions are monocrystalline and epitaxially related to one another.

4. A semiconductor device as set forth in claim 1 wherein the second region is of gallium arsenide.

5. A semiconductor device as set forth in claim 1 wherein the second region is of gallium arseno-phosphide $GaAs_{1-x}P_x$.

6. A semiconductor device as set forth in claim 1 wherein the second region is of n-type material and the first region is of p-type material forming a p-n junction.

7. A semiconductor device comprising at least first and second adjacent regions forming a junction, said first region consisting essentially of manganese arsenide isomorphous with the compound $Mn_2As$ and having a composition in the range of $Mn_{1.9}As$ to $Mn_{2.3}As$, said second region being selected from the group consisting of a III–V compound and a substituted III–V compound, wherein the III element is at least one member selected from the group consisting of boron, aluminum, gallium and indium, and the V element is at least one member selected from the group consisting of nitrogen, phosphorus, arsenic and antimony, said first and second regions being monocrystalline and separated by a region whose thickness is at most of the order of one micron.

8. A semiconductor device as set forth in claim 7 wherein the second region is a substrate, the first region is a recrystallized layer, and adjacent the first region on the side remote from the substrate is a solidified mass consisting predominantly of a carrier material containing manganese and arsenic in small amounts.

9. A semiconductor device as set forth in claim 8 wherein the carrier is bismuth.

10. A semiconductor device as set forth in claim 9 wherein the resolidified mass includes indium.

11. A semiconductor device as set forth in claim 7 wherein means are provided to enable said junction to receive external radiation, said device functioning as a photocell.

12. A semiconductor device as set forth in claim 7 wherein said junction constitutes the collector junction of an opto-electronic transistor.

13. A semiconductor device as set forth in claim 12 wherein said second region is of gallium arsenide and constitutes the base region of the transistor, and said first region constitutes the collector region.

14. A method of making a semiconductor device comprising at least first and second adjacent regions forming a junction, said first region consisting essentially of manganese arsenide isomorphous with the composition $Mn_2As$ and having approximately the same empirical formula, said second region being selected from the group consisting of a III–V compound and a substituted III–V compound wherein the III element is at least one member selected from the group consisting of boron, aluminum, gallium and indium, and the V element is at least one member selected from the group consisting of nitrogen, phosphorus, arsenic and antimony, said first and second regions being monocrystalline and epitaxially related, comprising the steps of providing a monocrystalline body of a material of one of said regions, and epitaxially growing on said body a monocrystalline portion of the material of said other region.

15. A method as set forth in claim 14 wherein the body constitutes the second region, and the epitaxial portion is of manganese arsenide.

16. A method as set forth in claim 15 wherein the second region is of gallium arsenide.

17. A method as set forth in claim 15 wherein a carrier material containing manganese is surface alloyed to an arsenic-containing body to form a recrystallized region of manganese arsenide.

18. A method as set forth in claim 15 wherein a carrier material containing manganese arsenide is surface alloyed to the body to form a recrystallized region of manganese arsenide.

19. A method as set forth in claim 17 wherein the carrier is of bismuth.

20. A method as set forth in claim 18 wherein the carrier is of bismuth.

References Cited

UNITED STATES PATENTS

| | | | |
|---|---|---|---|
| 2,798,989 | 7/1957 | Welker | 148—173 |
| 2,847,335 | 8/1958 | Gremmelmaier et al. | 148—33.6 |
| 2,956,216 | 10/1960 | Jenny et al. | 148—33.6 |

DAVID L. RECK, *Primary Examiner.*

N. F. MARKVA, *Assistant Examiner.*

UNITED STATES PATENT OFFICE

CERTIFICATE OF CORRECTION

Patent No. 3,357,870 December 12, 1967

John Robert Dale

It is hereby certified that error appears in the above numbered patent requiring correction and that the said Letters Patent should read as corrected below.

Column 3, line 14, for "constructed," read -- constructed. --; column 4, line 44, for "simlar" read -- similar --; column 8, line 73, for "the invention described relative to photo-diodes, the man-" read -- to giving the body a light etch in a solution of bromine --.

Signed and sealed this 25th day of February 1969.

(SEAL)
Attest:

Edward M. Fletcher, Jr.
Attesting Officer

EDWARD J. BRENNER
Commissioner of Patents